(12) United States Patent
Smith et al.

(10) Patent No.: US 9,953,876 B1
(45) Date of Patent: Apr. 24, 2018

(54) METHOD OF FORMING A SEMICONDUCTOR DEVICE STRUCTURE AND SEMICONDUCTOR DEVICE STRUCTURE

(71) Applicant: GLOBALFOUNDRIES Inc., Grand Cayman (KY)

(72) Inventors: Elliot John Smith, Dresden (DE); Hans-Juergen Thees, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/282,211

(22) Filed: Sep. 30, 2016

(51) Int. Cl.
*H01L 21/8234* (2006.01)
*H01L 27/088* (2006.01)
*H01L 29/51* (2006.01)

(52) U.S. Cl.
CPC ........ *H01L 21/823462* (2013.01); *H01L 21/823418* (2013.01); *H01L 21/823468* (2013.01); *H01L 27/0883* (2013.01); *H01L 29/518* (2013.01)

(58) Field of Classification Search
CPC . H01L 27/1203; H01L 21/84; H01L 29/6656; H01L 21/0217; H01L 29/6653; H01L 29/66553; H01L 29/66628; H01L 29/401; H01L 21/823857; H01L 21/823468; H01L 21/823462; H01L 21/823864; H01L 29/42364; H01L 27/088
See application file for complete search history.

(56) References Cited

U.S. PATENT DOCUMENTS

| | | | |
|---|---|---|---|
| 5,266,507 A | 11/1993 | Wu | |
| 5,317,178 A | 5/1994 | Wu | |
| 6,049,114 A * | 4/2000 | Maiti | H01L 21/823842 257/412 |
| 6,468,877 B1 * | 10/2002 | Pradeep | H01L 21/764 257/E21.573 |
| 6,642,543 B1 | 11/2003 | El Gamal et al. | |
| 6,670,248 B1 | 12/2003 | Ang et al. | |
| 7,402,480 B2 | 7/2008 | Hebert et al. | |
| 7,410,874 B2 | 8/2008 | Verma et al. | |
| 7,529,117 B2 | 5/2009 | Liaw | |
| 7,691,663 B2 | 4/2010 | Lee | |
| 7,741,987 B2 | 6/2010 | Yung et al. | |
| 8,143,626 B2 | 3/2012 | Lee | |
| 8,222,680 B2 | 7/2012 | Lin et al. | |
| 8,629,023 B2 | 1/2014 | Lee | |

(Continued)

*Primary Examiner* — Caridad Everhart
(74) *Attorney, Agent, or Firm* — Amerson Law Firm, PLLC

(57) ABSTRACT

The present disclosure provides a method of forming a semiconductor device structure including forming a first gate stack comprising a first gate dielectric material and a first gate electrode material over a first active region in an upper portion of a substrate, forming a first spacer structure adjacent to the first gate stack, and forming first raised source/drain (RSD) regions at opposing sides of the first gate stack on the first active region in alignment with the first spacer structure. Herein, forming the first spacer structure includes forming a first spacer structure on sidewalls of the first gate stack, the first gate dielectric extending in between the first spacer and the upper surface portion, patterning the first gate dielectric material, and forming a second spacer over the first spacer and the patterned first gate dielectric material.

20 Claims, 10 Drawing Sheets

(56) References Cited

U.S. PATENT DOCUMENTS

| | | | |
|---|---|---|---|
| 2002/0171107 A1* | 11/2002 | Cheng | H01L 29/6656 257/347 |
| 2004/0217394 A1 | 11/2004 | Lee | |
| 2005/0282318 A1* | 12/2005 | Dao | H01L 29/78645 438/151 |
| 2007/0077716 A1* | 4/2007 | Chen | H01L 21/823807 438/300 |
| 2007/0120159 A1 | 5/2007 | Lee | |
| 2007/0120726 A1 | 5/2007 | Yung et al. | |
| 2007/0173024 A1* | 7/2007 | Goktepeli | H01L 21/28132 438/299 |
| 2009/0079604 A1 | 3/2009 | Yung et al. | |
| 2010/0163942 A1 | 7/2010 | Lee | |
| 2012/0178206 A1 | 7/2012 | Lee | |
| 2015/0325577 A1 | 11/2015 | Hu et al. | |
| 2016/0035861 A1* | 2/2016 | Park | H01L 29/66545 438/301 |

* cited by examiner

METHOD OF FORMING A SEMICONDUCTOR DEVICE STRUCTURE AND SEMICONDUCTOR DEVICE STRUCTURE

BACKGROUND

1. Field of the Disclosure

The present disclosure generally relates to a method of forming a semiconductor device structure and to a semiconductor device structure. More particularly, the present disclosure relates to the co-integration of semiconductor devices having different gate dielectric thicknesses into a complex semiconductor device structure.

2. Description of the Related Art

Efforts to integrate more and more different types of semiconductor devices on a semiconductor chip has resulted in the fabrication of integrated circuits having critical dimensions reaching into the deep sub-micron region, currently at 22 nm and beyond. A MOSFET device or MOS device represents an important example of a semiconductor device. In a MOSFET device, a current flow between two contacts, conventionally referred to as source and drain, is controlled in dependence on a voltage applied to a gate electrode located adjacent to the channel. Generally, the gate electrode is separated from the channel by means of a gate oxide. Upon scaling MOS devices, the length of the channel is scaled down, resulting in a down-scaling of the supply voltage to the gate electrode and the thickness of the gate oxide. The thickness of the gate oxide and the range of voltages supplied to the gate electrode interdepend on each other, because the gate oxide may break down at a too-high-of an electric field induced by the voltage supply to the gate electrode. A given gate oxide thickness demands a certain level of voltage supplied to the gate electrode as well, in order to ensure a sufficient coupling of the gate electrodes to the channel region.

The fabrication of integrated circuits often requires the formation of gate insulation layers having varying degrees of thickness and composition, e.g., when fabricating systems on a chip (SoC). Herein, circuits for input/output (I/O) connections, circuits with high performance and circuits with low power consumption are fabricated on the same chip. For example, high voltage power transistors and transistors used to program EEPROM devices require thicker gate oxides than lower voltage transistors used in memory storage in DRAM circuits.

Conventionally, most devices are distinguished regarding the thickness of the gate dielectric as follows: devices having a thin gate dielectric (e.g., a thickness up to about 2 nm, such as having a thickness at about 1 nm) are referred to as "SG devices," devices having a normal gate dielectric (e.g., a thickness in a range from about 2-5 nm, such as having a thickness at about 3.5 nm) are referred to as "EG devices," and devices having a relatively thick gate dielectric (e.g., a thickness of at least 5 nm, such as a thickness at about 6.6 nm) are referred to as "ZG devices." Under current day technology, in one illustrative example, the permissible voltage values by which these devices may be operated are as follows: SG devices may be operated between 0.6 and 1.2 V; EG devices may be operated in a range from about 1.2 to about 1.8 V; and ZG devices may be operated at voltages greater than 1.8 V, e.g., at 2.5 V and 3.3 V.

With regard to FIGS. 1a-1g, a known process flow of forming a semiconductor device structure co-integrating semiconductor devices having different gate oxide thicknesses will be described.

FIG. 1a schematically illustrates a semiconductor structure 1 at an early stage during fabrication, e.g., at front-end-of-line (FEOL) processing prior to gate patterning. FIG. 1a schematically illustrates a first active region provided in an upper surface portion 2A of a substrate of a semiconductor wafer (not illustrated), and another active region provided in an upper surface portion 2B of the substrate of the semiconductor wafer (not illustrated), the upper surface portions 2A and 2B being possibly separated by at least one trench isolation (not illustrated), such as at least one shallow trench isolation (STI; not illustrated) formed in between.

Still referring to FIG. 1a, the semiconductor device structure 1 may comprise a semiconductor device 10A and a semiconductor device 10B. At the illustrated stage, the semiconductor device 10A comprises a layer stack formed over the upper surface portion 2A, the layer stack being formed by a gate oxide layer 4A formed on the upper surface portion 2A, a gate electrode material 6A formed on the gate oxide 4A, and a capping material 7A formed on the gate electrode material 6A. The semiconductor device 10B comprises a gate oxide layer 4B, a gate electrode material 6B disposed on the gate oxide 4B, and a cap material 7B disposed on the gate electrode material 6B. The gate oxide materials 4A, 4B have different thicknesses, e.g., the semiconductor device 10A may be intended as one of an SG device and an EG device, while the semiconductor device 10B may be intended as a ZG device.

FIG. 1b schematically illustrates the semiconductor device structure 1 at a more advanced stage during fabrication, after masking patterns 11A and 11B are formed. At the stage during fabrication as schematically illustrated in FIG. 1b, an anisotropic etching process 12 may be performed in alignment with the mask patterns 11A and 11B. Herein, the anisotropic etching process 12 is designed to land on the gate oxide materials 4A and 4B so as to avoid any attack of the upper surface portion 2A caused by the small thickness of the gate oxide material 4A.

FIG. 1c schematically illustrates the semiconductor device structure 1 at a more advanced stage during fabrication, after the anisotropic etching process 12 is completed. As discussed above, upon completion of the anisotropic etching process 12, the gate oxide materials 4A and 4B are exposed in alignment with the masking patterns 11A and 11B in FIG. 1b. Accordingly, a gate stack 8A comprising the patterned gate electrode material 6A and the patterned gate cap 7A is formed. Similarly, a gate stack 8B comprising the patterned gate electrode material 6B and the patterned gate cap 7B is formed.

Referring to FIG. 1d, an etch pass clean step 14, typically an isotropic wet etch step, is performed to remove the gate oxide material 4A in alignment with the gate stack 8A. It is important to note that the thickness of the gate oxide material 4A imposes limits on the etch pass clean step 14 when any attack of the upper surface portion 2A is to be avoided. For example, the gate oxide material 4A imposes an upper limit on an etching time of the etch pass clean step 14.

Referring to FIG. 1d, the semiconductor device structure 1 is schematically illustrated at the end of the etch pass clean step 14, wherein the gate oxide material 4A is removed from above the upper surface portion 2A in alignment with the gate stack 8A resulting in the gate stack 8A being formed by the patterned gate oxide material 4A, the patterned gate electrode material 6A and the patterned gate cap 7A. Generally, the gate oxide material 4A may be completely removed during the etch pass clean step 14 adjacent to the gate stack 8A. However, due to the increased thickness of the gate oxide material 4B (i.e., in the case of ZG devices), the gate oxide material 4B is not completely removed from above the upper surface portion 2B adjacent to the gate stack 8B of the semiconductor device 10B. Therefore, the upper surface portion 2B still remains covered by the remaining portions of the gate oxide material 4B. Particularly, the upper surface portion 2B is not exposed to further processing and the gate oxide material 4B is not completely patterned, that is, the upper surface portion 2B is not exposed adjacent to the gate stack 8B. It is noted that exposed sidewalls of the gate electrode material 6B are not in line with sidewall portions of the gate oxide material 4B.

Referring to FIG. 1e, the semiconductor device structure 1 is schematically illustrated at a more advanced stage during fabrication, at which a spacer material 16A is deposited over the gate stack 8A, and a spacer material 16B is deposited over the gate stack 8B. Typically, silicon nitride is used as the spacer material 16A and the spacer material 16B.

Referring to FIG. 1f, the semiconductor device structure is illustrated at a more advanced stage during fabrication, particularly after spacers 16'A and 16'B are formed adjacent to the gate stacks 8A and 8B by means of anisotropic etching (not illustrated). By contrast to the spacer 16'A, the spacer 16'B is not in contact with the upper surface portion 2B and the gate oxide material 4B extends below the spacer 16'B, forming extension portions indicated by reference numerals 18 in FIG. 1f, the extension portions 18 extending between the spacer 16'B and the upper surface portion 2B. The extension portions 18 are formed as a result of the incomplete removal of the gate oxide material 4B.

Referring to FIG. 1g, the semiconductor device structure 1 is schematically illustrated at a more advanced stage during fabrication, after raised source/drain (RSD) regions 20 are epitaxially grown on the upper surface portion 2A and in alignment with the spacers 16'A, and the extension portions 18 over the upper surface portion 2B and in alignment with the spacers 16'B. That is, with regard to the semiconductor device 10B, the gate oxide material 4B is not separated from the RSD regions, but shares a common interface with the RSD regions at the extension regions 18.

It is believed that the semiconductor device 10B suffers from leakage pass caused by the extension regions 18 extending below the spacer 16'B into contact with the RSD regions 20 due to the less insulating properties of the gate oxide material 4B when compared to silicon nitride used for the spacer 16'B. For example, charge carriers may tunnel through the extension regions 18. Charge may also be stored in the interfaces of the different materials (e.g., between the spacer 16'B and the gate oxide material (GOX) 4B or between the GOX 4B and the substrate material 2B) causing a reliability breakdown. By contrast, the semiconductor device 10A has the gate oxide material 4A reliably encapsulated by the spacer 16'A separating the RSD regions 20 from the gate oxide material 4A.

As discussed above with regard to FIGS. 1a-1g, current techniques for co-integrating semiconductor devices having different gate thicknesses, i.e., SG devices and/or EG devices together with ZG devices, lead to ZG devices suffering from an increased leakage between the gate electrode of ZG devices and the raised source drain regions.

However, considerations on increasing the etch pass clean step 14 (FIG. 1c) increase the risk of damaging or degrading the SG and EG devices, because upon the etch pass clean step being an isotropic etching, the upper surface regions and the gate oxide material of SG devices and EG devices cannot be reliably protected until the gate oxide of ZG devices is completely patterned.

It is also noted that the spacer formation of the ZG devices is not limited to what is presented here. It is understood that SG, EG and ZG devices can have different spacer thicknesses relatively independent of one another, based on the requirements of the device. A simple spacer 16'A, similar to 16'B is provided for simplification of describing the present invention.

In view of the above discussion, it is therefore desirable to provide a semiconductor device structure and a method of forming a semiconductor device structure with improved leakage and reliability properties.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a method of forming a semiconductor device structure is provided. In accordance with some illustrative embodiments herein, the method includes forming a first gate stack comprising a first gate dielectric and a first gate electrode over a first active region in an upper surface portion of a substrate, forming a first spacer structure adjacent to the first gate stack, and forming a first raised source/drain (RSD) region at opposing sides to the first gate stack on the first active region in alignment with the first spacer structure. Herein, the forming of the first spacer structure includes forming a first spacer on sidewalls of the first gate stack, the first gate dielectric material extending between the first spacer and the upper surface portion, patterning the first gate dielectric material, and forming a second spacer over the first spacer and the patterned first gate dielectric material.

In a second aspect of the present disclosure, a semiconductor device structure is provided. In accordance with some illustrative embodiments herein, the semiconductor device structure includes a first active region provided in an upper surface portion of a substrate, a first gate stack formed over the first active region, the first gate stack comprising a first gate dielectric material and a first gate electrode material, a first spacer structure formed on the first gate stack, wherein the first spacer structure contacts the upper surface portion of the substrate adjacent to the first gate dielectric material, and first raised source/drain (RSD) regions formed at opposing sides of the first gate stack on the first active region in alignment with the first spacer structure, wherein the first spacer structure has a target thickness in a range from about 5-15 nm, and the first gate dielectric material comprises a layer of silicon oxide having a thickness of at least 3 nm.

BRIEF DESCRIPTION OF THE DRAWINGS

The disclosure may be understood by reference to the following description taken in conjunction with the accompanying drawings, in which like reference numerals identify like elements, and in which.

Figure 1A:
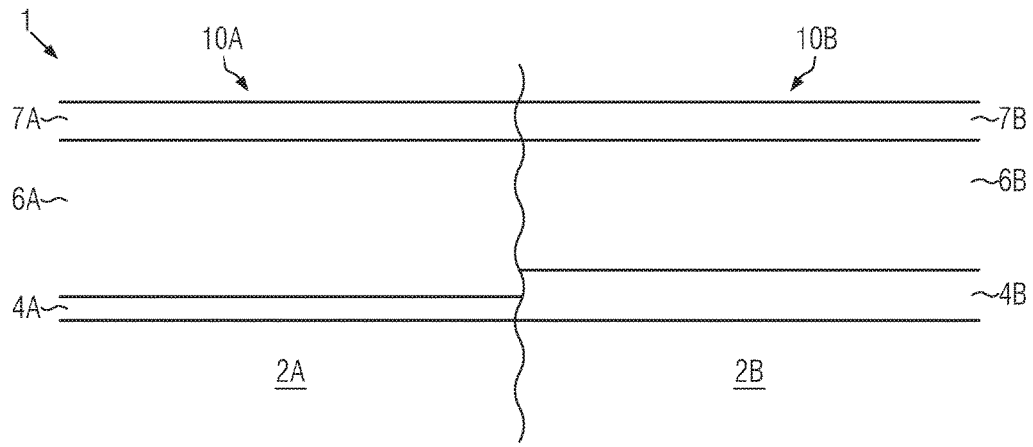
FIGS. 1a-1g schematically illustrate a known process of forming a semiconductor device structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device structure and to a semiconductor device structure, comprising at least one semiconductor device integrated on and/or in a chip. In accordance with some illustrative embodiments of the present disclosure, the semiconductor device structure may substantially comprise at least one FET, e.g., a MOSFET or MOS device. When referring to MOS devices, the person skilled in the art will appreciate that, although the expression "MOS device" is used, no limitation to a metal-containing gate material and/or to an oxide-containing gate dielectric material is intended.

Semiconductor devices as comprised of semiconductor device structures of the present disclosure concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. After a complete review of the present application, the person skilled in the art will appreciate that, according to the present disclosure, ground rules smaller or equal to 45 nm, e.g., at 22 nm or below, may be imposed, but that the present invention is not limited to such examples. After a complete review of the present application, the person skilled in the art will also appreciate that the present disclosure may be employed in fabricating semiconductor devices with structures of minimal length dimensions and/or width dimensions smaller than 100 nm, for example, smaller than 50 nm or smaller than 35 nm or smaller than 22 nm. For example, the present disclosure may provide semiconductor devices fabricated by using 45 nm technologies or below, e.g., 22 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In accordance with some illustrative embodiments of the present disclosure, a semiconductor device structure may comprise at least one semiconductor device. In accordance with illustrative examples herein where a semiconductor device structure comprises two semiconductor devices, the two semiconductor devices may be separated by at least one intermediate isolation structure, e.g., a trench isolation structure (for example, a shallow trench isolation structure). In accordance with some other illustrative examples herein where a semiconductor device structure comprises three or more semiconductor devices, an isolation structure, e.g., a trench isolation structure (for example, a shallow trench isolation structure), may be disposed between two adjacent semiconductor devices.

In general, SOI devices may have an active semiconductor layer disposed on a buried insulating material layer, which in turn may be formed on a base substrate material. In accordance with some illustrative embodiments herein, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like. After a complete review of the present application, the person skilled in the art will appreciate that, in accordance with illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 6-10 nm.

As to a crystallographic plane orientation of the base substrate material, similar to that of an ordinary silicon device, an SOI substrate whose surface is a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. With regard to a varactor device, there is no restriction on a crystal plane orientation such that an impurity concentration, film thickness, dimension ratio of the device and the like may be appropriately adjusted to obtain a capacitance characteristic that is suitable according to the plane orientation set by other requirements. In alternative embodiments, the base substrate material may be of an N-type when N-accumulation and/or N-inversion devices are considered (otherwise P-type for P-accumulation and/or P-inversion).

With regard to FIGS. 2a-2i, various illustrative embodiments of the present disclosure are disclosed.

Figure 2A:
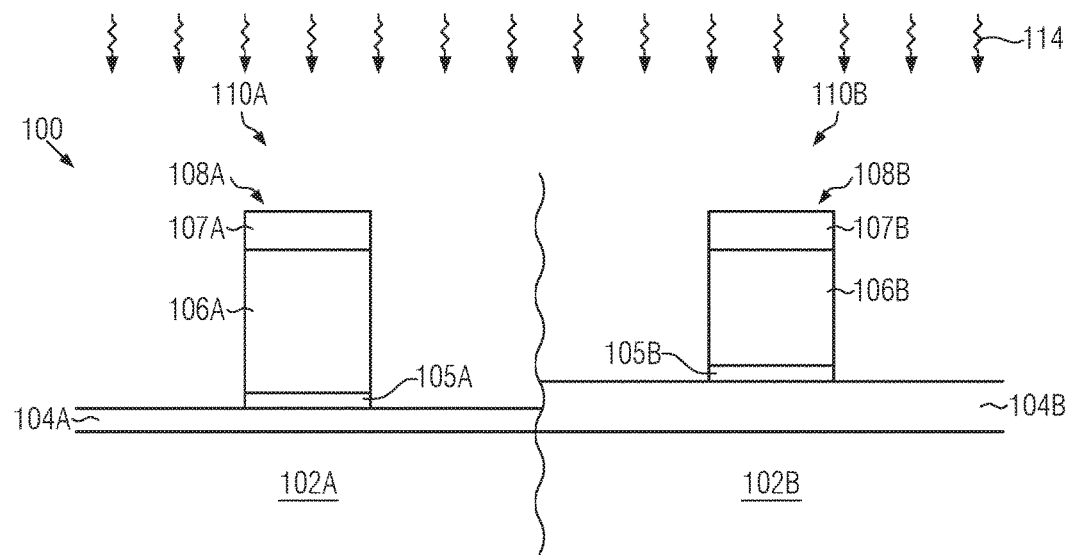
FIGS. 2a-2i schematically illustrate a method of forming a semiconductor device structure in accordance with some illustrative embodiments of the present disclosure.

FIG. 2a schematically illustrates, in a cross-sectional view, a semiconductor device structure 100 during FEOL processing, after a deposited gate electrode material is patterned in accordance with known patterning techniques to obtain a gate stack 108A over an upper surface portion 102A of a substrate in an active region of the substrate and to obtain a gate stack 108B over an upper surface portion 102B of the substrate in another active region of the substrate. As schematically illustrated in FIG. 2a, the semiconductor device structure 100 may comprise a semiconductor device 110A, comprising the gate stack 108A formed over the upper surface portion 102A of the substrate.

In accordance with some illustrative embodiments of the present disclosure, the substrate may be an SOI substrate as described above. In accordance with some special illustrative examples herein, the substrate may be provided in accordance with FDSOI techniques. Herein, the upper surface portion 102A may be provided in an active semiconductor layer disposed on a buried insulating material layer (not illustrated), which in turn may be formed on a base substrate material (not illustrated) as described above.

At the stage illustrated in FIG. 2a, the gate stack 108A may comprise a patterned gate cap 107A, a patterned gate electrode material 106A, and a patterned layer structure 105A comprising a layer of a work function adjusting material, e.g., TiN and the like, and/or a high-k material layer, e.g., hafnium oxide, hafnium silicate, hafnium oxynitride and the like, and/or a ferroelectric material layer, e.g., a ferroelectric hafnium oxide material and the like. Below the patterned gate electrode material 106A over the upper surface portion 102A, a gate dielectric material 104A may be formed. At the initial stage illustrated in FIG. 2a, the gate dielectric material 104A may not be patterned yet.

In accordance with some illustrative embodiments of the present disclosure, the gate dielectric material 104A may comprise silicon oxide, e.g., silicon dioxide. In accordance with some illustrative embodiments of the present disclosure, the gate dielectric material 104A may have a thickness of at most about 5 nm. After a complete reading of the present disclosure, the person skilled in the art will appreciate that the semiconductor device 110A may be targeted as one of an SG device and an EG device.

In accordance with some illustrative embodiments of the present disclosure, the patterned gate cap 107A may comprise silicon nitride.

Furthermore, the gate stack 108B may comprise a patterned gate cap 107B, a patterned gate electrode material 106B, and a patterned layer structure 105B comprising a layer of a work function adjusting material, e.g., TiN and the like, and/or a high-k material layer, e.g., hafnium oxide, hafnium silicate, hafnium oxynitride and the like, and/or a ferroelectric material layer, e.g., a ferroelectric hafnium oxide material and the like. Below the patterned gate electrode material 106B over the upper surface portion 102B, a gate dielectric material 104B may be formed. At the initial stage illustrated in FIG. 2a, the gate dielectric material 104B may not be patterned yet.

In accordance with some illustrative embodiments of the present disclosure, the gate dielectric material 104B may comprise silicon oxide, e.g., silicon dioxide. In accordance with some illustrative embodiments of the present disclosure, the gate dielectric material 104B may have a thickness of more than about 5 nm. After a complete reading of the present disclosure, the person skilled in the art will appreciate that the semiconductor device 110B may be targeted as a ZG device.

In accordance with some illustrative embodiments of the present disclosure, the patterned gate cap 107B may comprise silicon nitride.

Figure 1B:
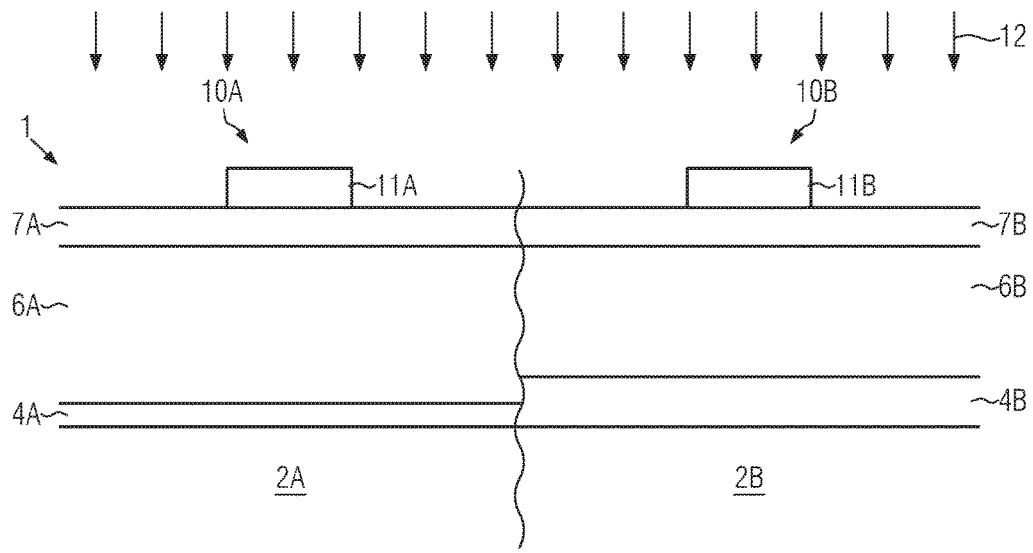
Figure 1C:
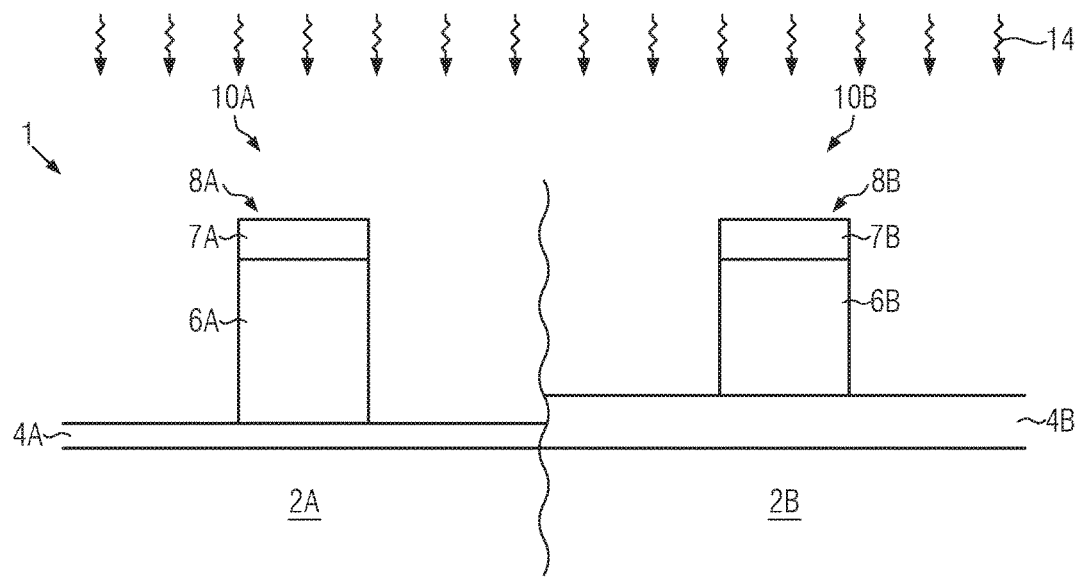
Figure 1D:
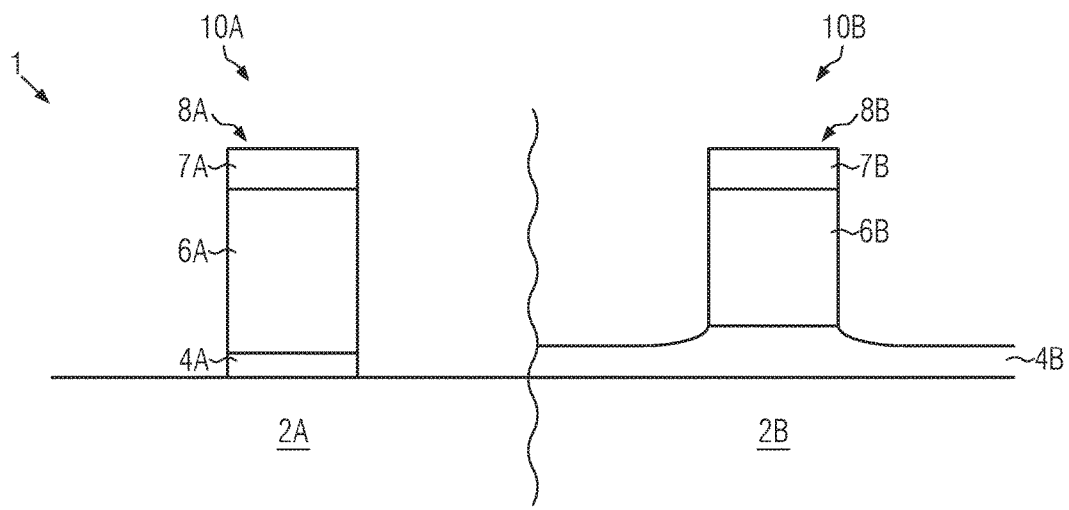
Figure 1E:
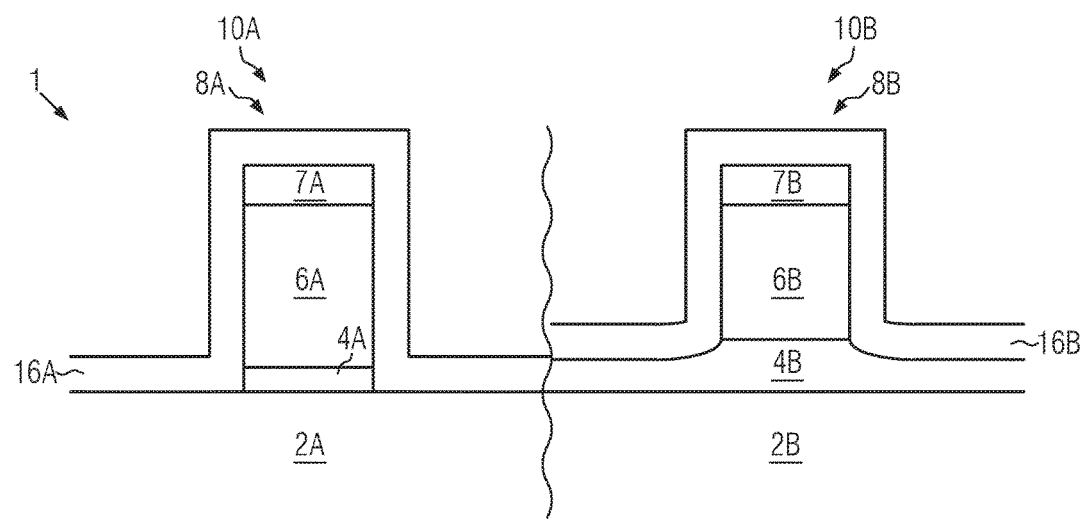
Figure 1F:
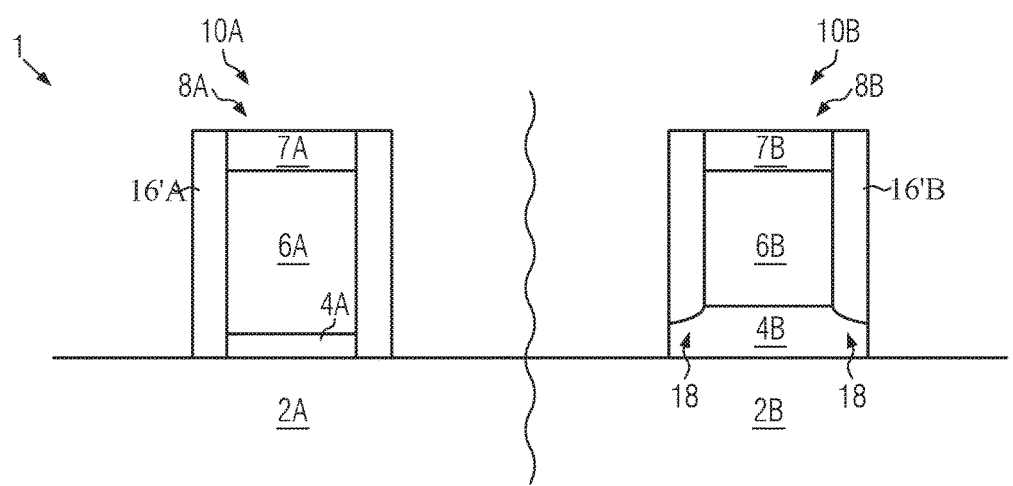
Figure 1G:
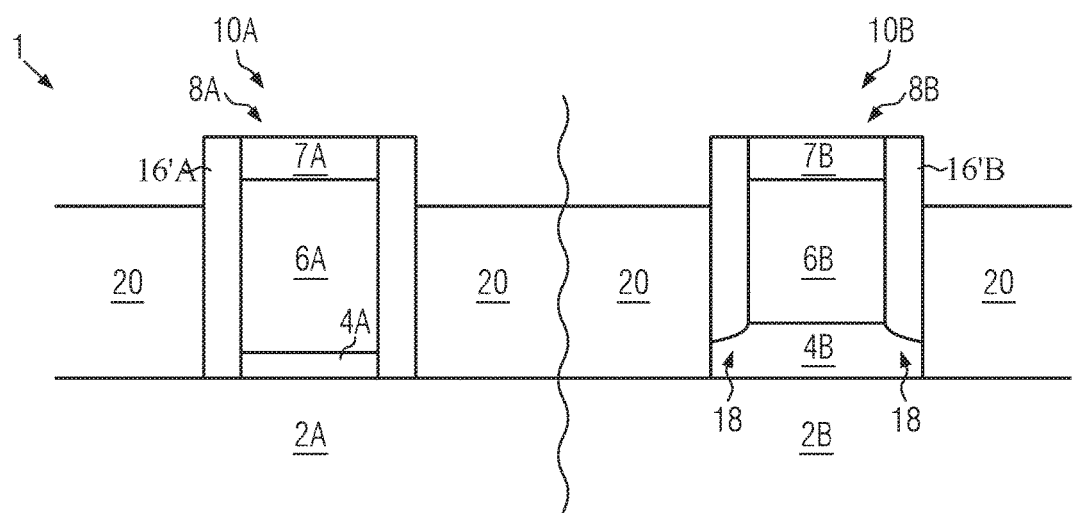

In accordance with some illustrative embodiments of the present disclosure, the stage illustrated in FIG. 2a may be subsequent to a processing as described above with regard to FIGS. 1a and 1b.

After having provided the semiconductor devices 110A and 110B as described above, wherein the gate stacks 108A and 108B still comprise the yet as of yet un-patterned dielectric materials 104A and 104B, an etching process 114, e.g., an etch pass clean process comprising an isotropic etch process, e.g., similar or equal to the above-described etch pass clean process 14, may be performed for patterning the gate dielectric materials 104A and 104B in alignment with the patterned gate stacks 108A and 108B. In accordance with some special illustrative examples herein, the etch pass clean process 114 may comprise a wet etch process with dHF.

In accordance with some illustrative embodiments of the present disclosure, the etch pass clean process 114 may be time controlled based on the thickness of the gate dielectric material 104A so as to expose the upper surface portion 102A adjacent to the gate stack 108A.

Figure 2B:
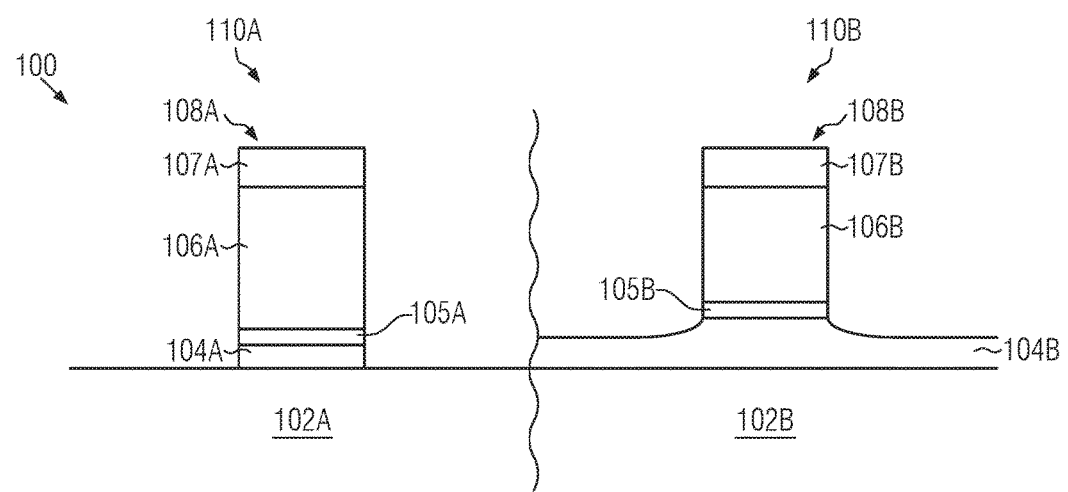

Referring to FIG. 2b, the semiconductor device structure 100 is schematically illustrated at a more advanced stage during fabrication, particularly after the etch pass clean process 114 described above is completed and the gate dielectric material layer 104A is patterned in alignment with the gate stack 108A. Accordingly, the patterned dielectric material 104A becomes part of the patterned gate stack 108A.

By contrast, the gate dielectric material 104B is not completely removed from above the upper surface portion 102B and the gate dielectric material 104B does not expose the upper surface portion 102B. That is, the upper surface portion 102B remains covered by the remaining portions of the gate dielectric material 104B and sidewalls of the gate dielectric material layer are not exposed adjacent to the gate stack 108B.

Figure 2C:
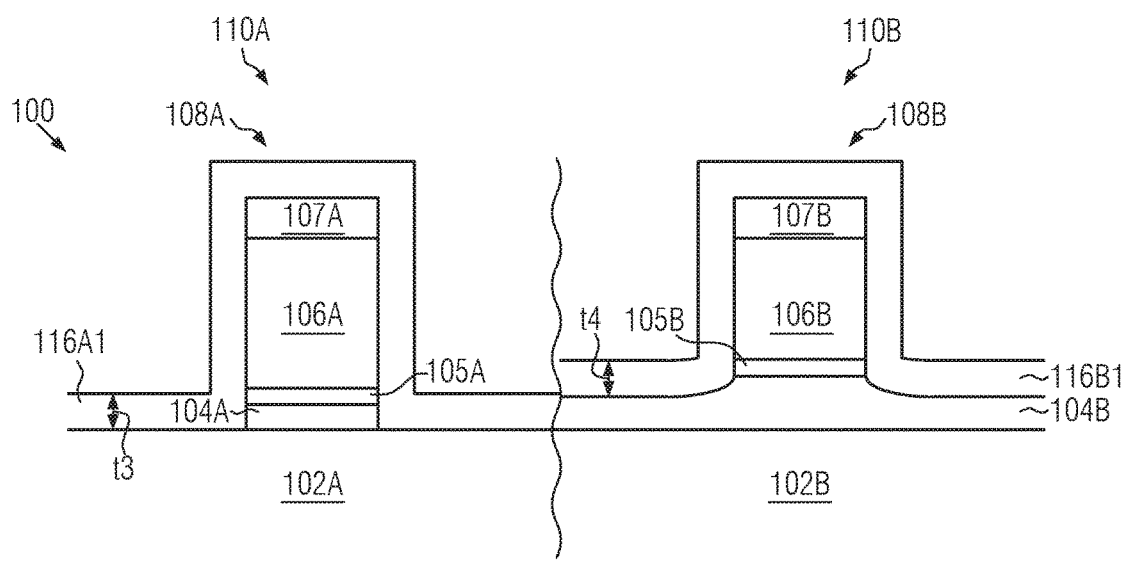

Referring to FIG. 2c, the semiconductor device structure 100 is schematically illustrated at a more advanced stage during fabrication, after a spacer material layer 116A1 is deposited over the semiconductor device 110A, and a spacer material layer 116B1 is deposited over the semiconductor device 110B.

In accordance with some illustrative examples herein, the spacer material layer 116A1 may be blanket-deposited over the upper surface portion 102A and the gate stack 108A in accordance with conformal deposition techniques, e.g., chemical vapor deposition (CVD) techniques, such as low pressure CVD (LPCVD). In accordance with some explicit examples herein, the spacer material layer 116A1 may be formed by silicon nitride, or a low-k spacer like SiBCN or the like.

In accordance with some illustrative examples herein, the spacer material layer 116B1 may be blanket-deposited over the upper surface portion 102B and the gate stack 108B in accordance with conformal deposition techniques, e.g., chemical vapor deposition (CVD) techniques, such as low pressure CVD (LPCVD). In accordance with some explicit examples herein, the spacer material layer 116B1 may be formed by silicon nitride, or a low-k spacer like SiBCN or the like.

In accordance with some special illustrative examples of the present disclosure, the spacer material layer 116A1 may have a thickness t3 smaller than a target spacer thickness adjusting a separation between the gate stack 108A and later to be formed raised source/drain (RSD) regions (reference numeral 120 in FIG. 2i). For example, a target thickness t3 may be in a range from about 5-15 nm and the thickness t3 is smaller than the target thickness.

In accordance with some special illustrative examples of the present disclosure, the spacer material layer 116B1 may have a thickness t4 smaller than the target spacer thickness adjusting a separation between the gate stack 108B and the later to be formed raised source/drain (RSD) regions (reference numeral 120 in FIG. 2i). The thickness t4 may be smaller than the target thickness.

In accordance with some illustrative embodiments of the present disclosure, the spacer material layer 116A1 and the spacer material layer 116B1 may be formed in parallel. For example, the spacer material layer 116A1 and the spacer material layer 116B1 may be formed from the same material. For example, the spacer material layer 116A1 and the spacer material layer 116B1 may have about the same thickness, that is, the thickness t3 may be substantially equal to the thickness t4.

Figure 2D:
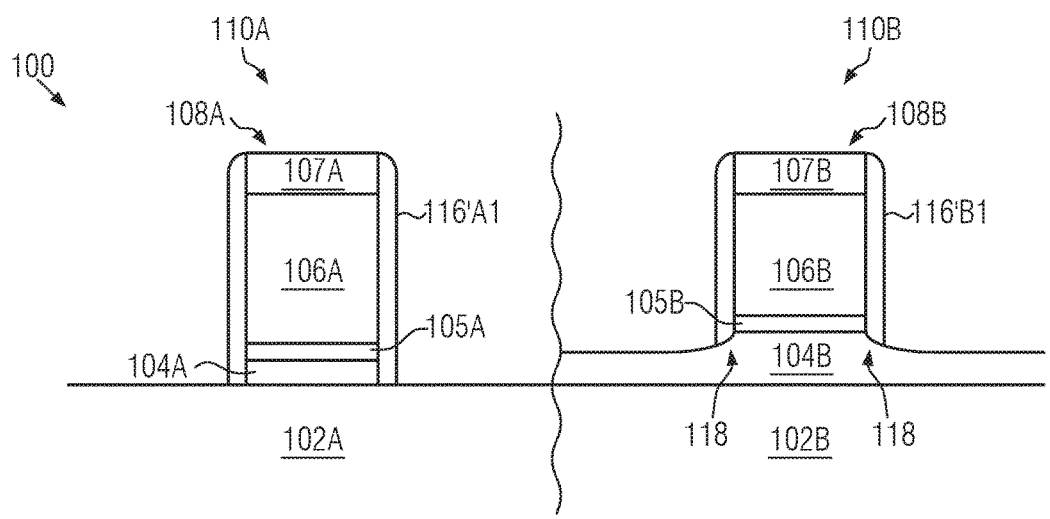

Referring to FIG. 2d, the semiconductor device structure 100 is schematically illustrated at a more advanced stage during fabrication, after an anisotropic etching process is performed for anisotropically etching the spacer material layers 116A1 and 116B1, resulting in spacers 116'A1 and 116'B1 as schematically illustrated in FIG. 2d. The spacers 116'A1 and 116'B1 may substantially cover sidewall portions of the gate electrode materials 106A and 106B and sidewalls of the material structures 105A and 105B.

In accordance with some illustrative embodiments of the present disclosure, the spacer 116'A1 may cover sidewalls of the gate dielectric material 104A and the spacer 116'A1 may be in contact with the upper surface portion 102A. That is, the gate dielectric material 104A may be reliably encapsulated by the spacer 116'A1. Particularly, the gate dielectric material 104A may be protected by the spacer 116'A1 from subsequent processing.

In accordance with some illustrative embodiments of the present disclosure, the spacer 116'B1 may be disposed on the gate dielectric material 104B, the gate dielectric material 104B extending below the spacer 116'B1. That is, the gate dielectric material 104B extends between the spacer 116'B1 and the upper surface portion 102B such that the spacer 116'B1 and the upper surface portion 102B are not in contact and extension regions 118 are formed.

In accordance with some illustrative embodiments of the present disclosure, the uppers surface portion 102B may be at least partially covered by the gate dielectric material 104B, e.g., a remaining gate dielectric material 104B may remain on the upper surface portion 102B, at least adjacent to the gate stack 108B.

In accordance with some illustrative embodiments of the present disclosure, a length of the gate dielectric material 104B extending below the gate electrode material 106B and between opposing sides of the gate stack 108B may be greater than a respective length of the gate electrode material 106B.

Figure 2E:
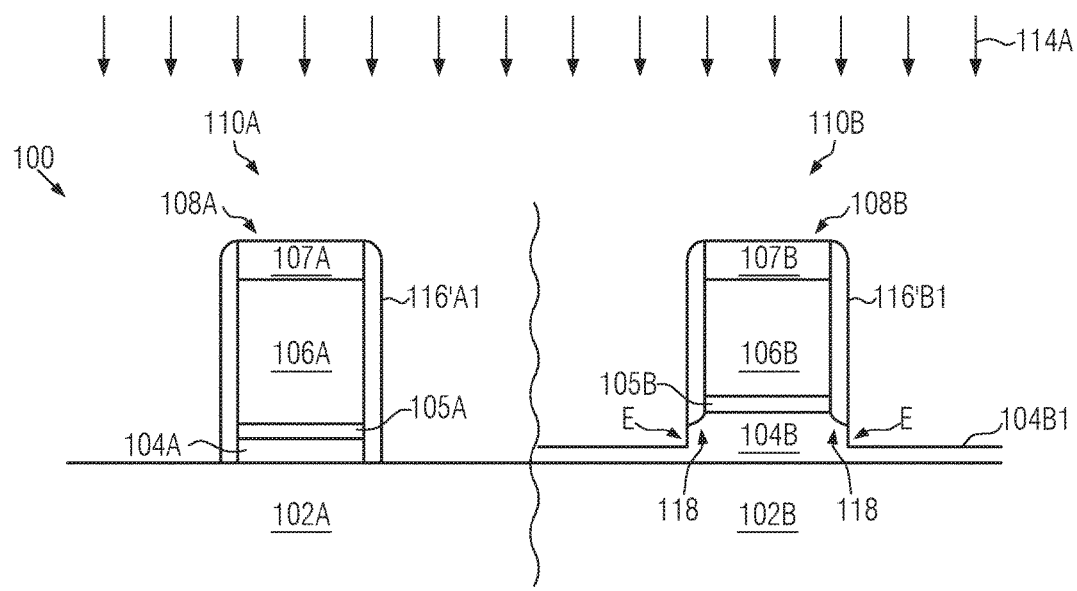

Referring to FIG. 2e, the semiconductor structure 100 is schematically illustrated at a more advanced stage during fabrication, after an isotropic etch process (not illustrated) is performed for removing the remaining gate dielectric material 104B over the upper surface portion 102B adjacent to the gate stack 108B. In accordance with some examples herein, an etching process may comprise HF, such as diluted HF (dHF) having less than 10% HF, e.g., about 1% HF.

The etching process 114A may continue to remove the remaining gate dielectric material 104B adjacent to the gate stack 108B. The etchant of the etching process 114A may also act along a direction indicated by arrows E in FIG. 2e, therefore attacking the extension regions 118 of the gate dielectric material 104B which extend below the spacer 116'B1 between the spacer 116'B1 and the upper surface portion 102B.

Figure 2F:
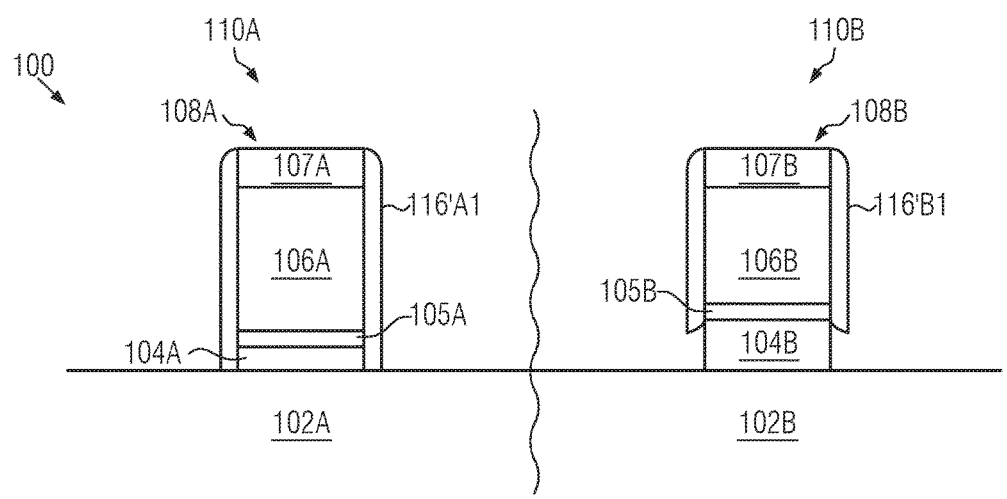

Referring to FIG. 2f, the semiconductor device structure 100 is schematically illustrated at the end of the etching process 114A, wherein the gate dielectric material 104B is shaped or trimmed back to expose bottom surfaces of the spacer 116'B1. Particularly, the extension regions 118 (FIGS. 2d and 2e) are removed from between the spacer 116'B1 and the upper surface portion 102B and the gate dielectric material 104B is patterned. In accordance with some illustrative examples herein, the gate dielectric material 104B may be shaped or trimmed back to about the same length of the gate electrode material 106B measured along a direction between two opposing sides of the gate stack 108B.

Figure 2G:
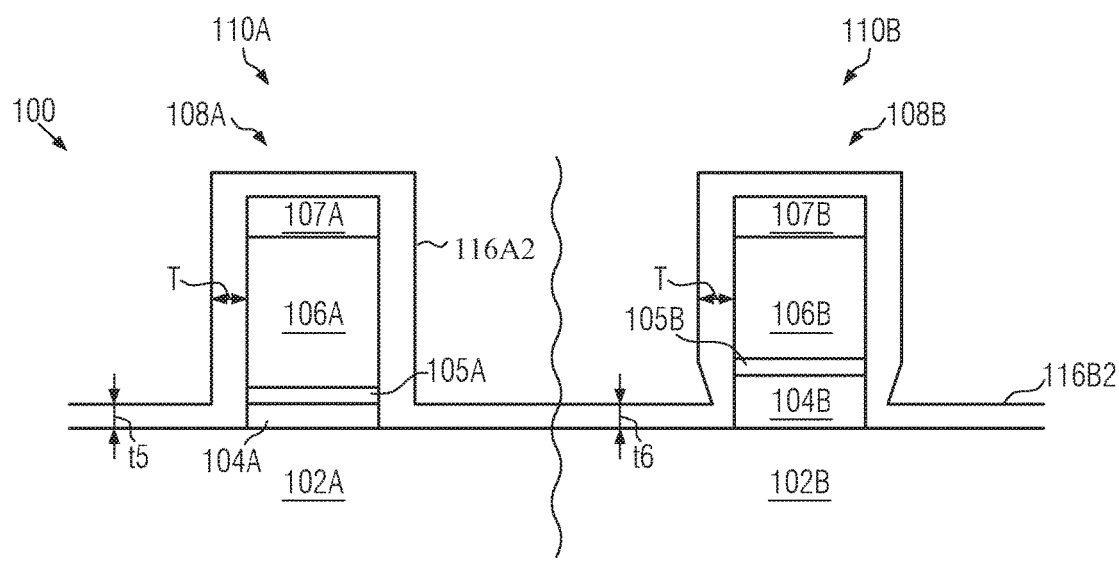

Referring to FIG. 2g, the semiconductor device structure 100 is schematically illustrated at a more advanced stage during fabrication, after a spacer material layer 116A2 is deposited over the upper surface portion 102A and the gate stack 108A, and after a spacer material layer 116B2 is deposited over the upper surface portion 102B and the gate stack 108B. In accordance with some explicit examples herein, the spacer material layers 116A2 and 116B2 may be formed by silicon nitride, or a low-k spacer like SiBCN or the like.

In accordance with some special illustrative examples of the present disclosure, the spacer material layer 116A2 may have a thickness t5 smaller than a target spacer thickness adjusting a separation between the gate stack 108A and later to be formed raised source/drain (RSD) regions (reference numeral 120 in FIG. 2i). For example, a target thickness may be in a range from about 5-15 nm and the thickness t5 is smaller than the target thickness.

In accordance with some illustrative embodiments of the present disclosure, the thickness t3 (FIG. 2c) and the thickness t5 may add up to about the target thickness T.

In accordance with some special illustrative examples of the present disclosure, the spacer material layer 116B2 may have a thickness t6 smaller than the target spacer thickness adjusting a separation between the gate stack 108B and the later to be formed raised source/drain (RSD) regions (reference numeral 120 in FIG. 2i). The thickness t6 may be smaller than the target.

In accordance with some illustrative embodiments of the present disclosure, the thickness t4 (FIG. 2c) and the thickness t6 may add up to about the target thickness T.

In accordance with some illustrative embodiments of the present disclosure, the spacer material layer 116A2 and the spacer material layer 116B2 may be formed in parallel. For example, the spacer material layer 116A2 and the spacer material layer 116B2 may be formed from the same material. For example, the spacer material layer 116A2 and the spacer material layer 116B2 may have about the same thickness, that is, the thickness t5 may be substantially equal to the thickness t6. However, this does not impose any limitation on the present disclosure and the person skilled in the art will appreciate that any other partition of the target thickness may be chosen.

Accordingly, a target thickness T may be adjusted for the spacer material covering the sidewalls of the gate stacks 108A and 108B. In accordance with some illustrative embodiments of the present disclosure, T may be in a range from about 5-15 nm.

In accordance with some illustrative examples herein, the following relations may apply: t3+t5 may be in range from about ±30% of the target thickness T, and/or t4+t6 may be in range from about ±30% of the target thickness, and/or t3≥t5, and/or t4≥t6 and/or vice versa.

Figure 2H:
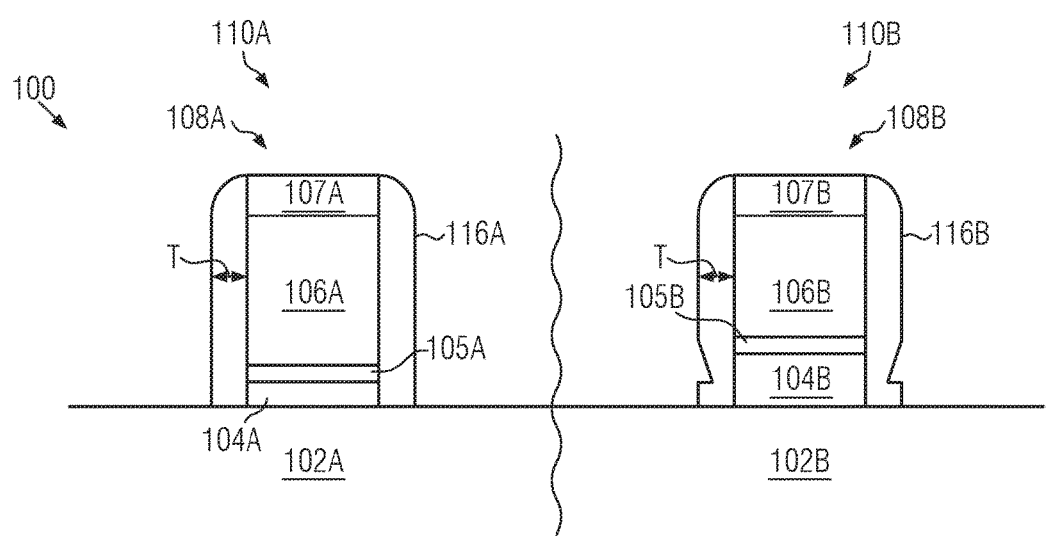

Referring to FIG. 2h, the semiconductor device 100 is schematically illustrated at a more advanced stage during fabrication, after a spacer structure 116A is formed adjacent to the gate stack 108A and a spacer structure 116B is formed adjacent to the gate stack 108B. The spacer structure 116A and/or the spacer structure 116B may be formed with the target thickness T. Referring to the semiconductor device 110B, the gate dielectric material 104B may be reliably encapsulated by the spacer structure 116B, that is, the spacer structure 116B may cover sidewalls of the gate dielectric material 104B and may be in contact with the upper surface portion 102B adjacent to the gate dielectric material 104B.

Figure 2I:
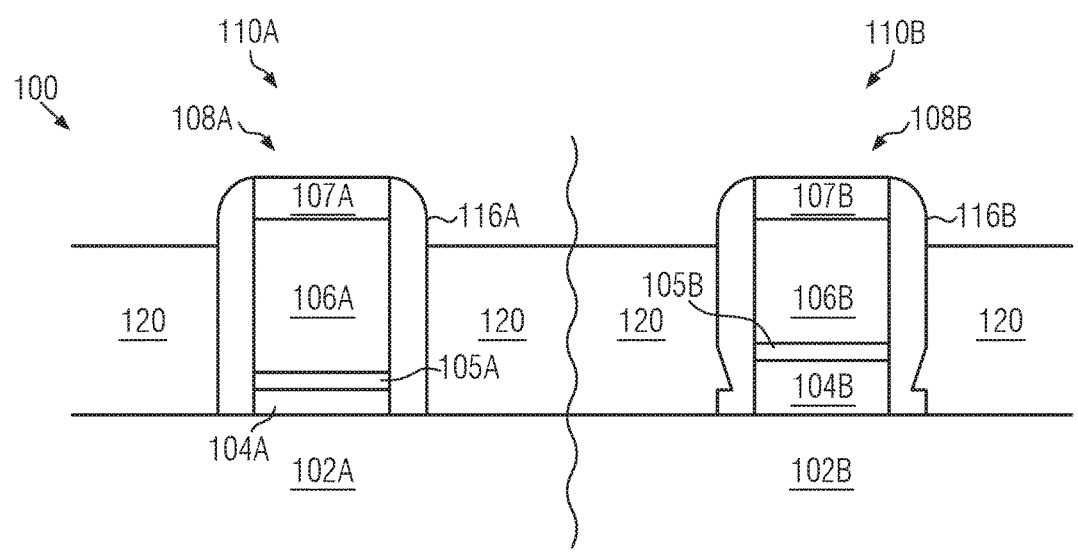

FIG. 2i schematically illustrates the semiconductor device structure at a more advanced stage during fabrication, after RSD regions 120 are formed over the upper surface portions 102A and 102B adjacent to the gate stacks 108A and 108B. In accordance with some illustrative embodiments herein, the RSD regions 120 may be formed successively or in parallel on the upper surface portions 102A and 102B. In accordance with some special illustrative examples, the RSD regions 120 may be formed by epitaxially growing a semiconductor material (doped or undoped), e.g., a silicon-comprising material, such as one of Si, SiC and SiGe. It is also understood that a ZG device may undergo further spacer formation steps resulting in a spacer 116B>116A (not illustrated).

After a complete reading of the present disclosure, the person skilled in the art will appreciate that the gate dielectric materials 104A and 104B may be reliably encapsulated by the spacer structures 116A, 116B and therefore leakage from the RSD regions 120 to the gate dielectric material 104B as well as charge build up in or at an interface to the dielectric material 104B may be avoided.

Figure 3:
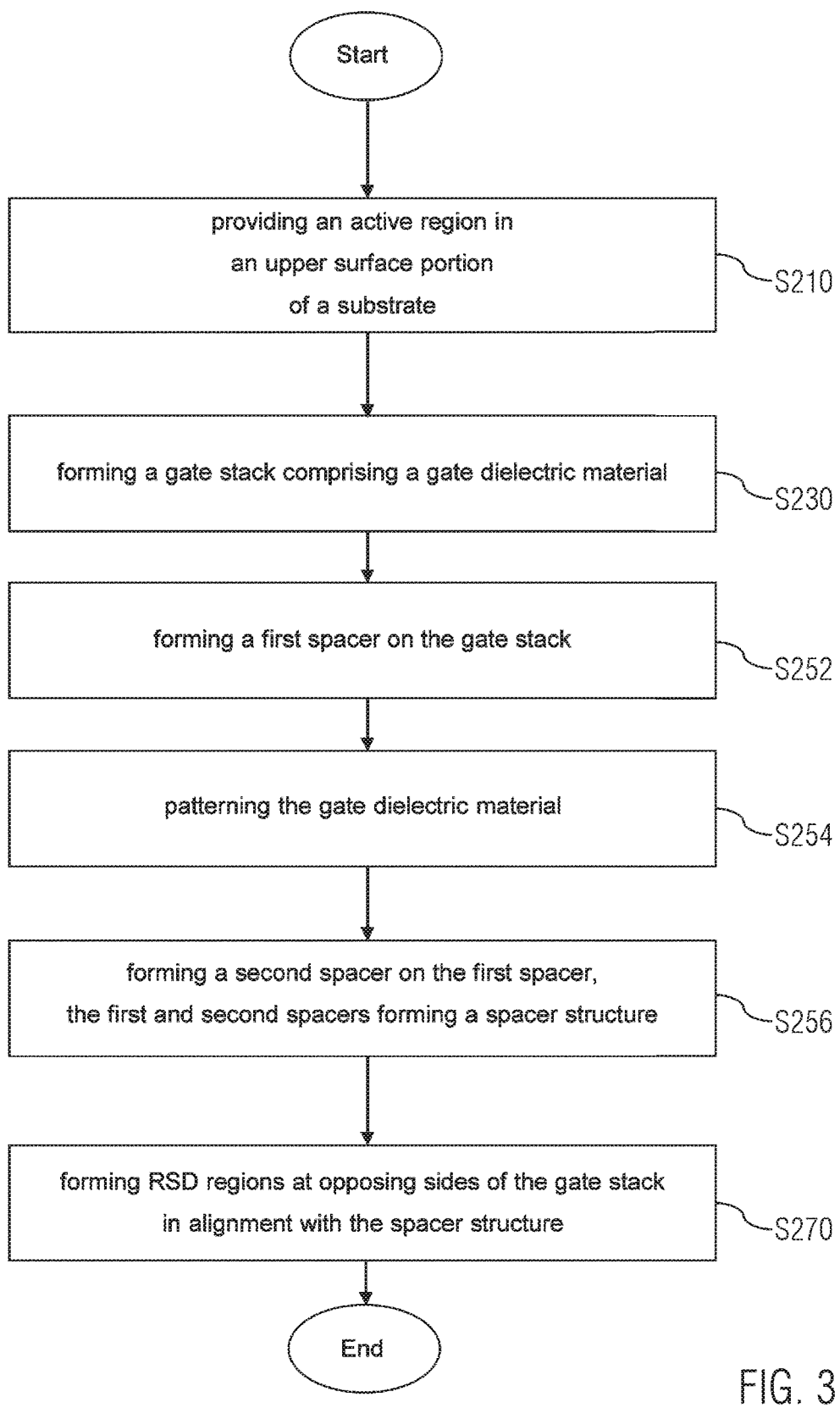
FIG. 3 schematically illustrates a flow diagram of a method of forming a semiconductor device structure in accordance with some illustrative embodiments of the present disclosure.

FIG. 3 schematically illustrates a flow diagram of a process of forming a semiconductor device. The semiconductor device may be comprised of a semiconductor device structure as described above.

At step S210, an active region may be provided in an upper surface portion of a substrate (e.g., 102B in FIGS. 2a-2i).

At step S230, a gate stack may be subsequently formed. The gate stack may comprise a gate electrode material and a gate dielectric material. In accordance with some illustrative examples of the present disclosure, the semiconductor device structure 110B as illustrated in FIGS. 2a and 2b may be obtained in accordance with step S230.

At step S252, a first spacer may be subsequently formed on the gate stack. In accordance with some illustrative examples of the present disclosure, the first spacer may correspond to the spacer 116'B1 as illustrated in FIG. 2d.

At step S254, the gate dielectric material may be subsequently patterned. In accordance with some illustrative examples of the present disclosure, the semiconductor device 110B illustrated in FIG. 2f may be obtained after step S254 is completed.

At step S256, a second spacer may be subsequently formed on the first spacer. The first and second spacers may form a spacer structure. In accordance with some illustrative examples of the present disclosure, the semiconductor device 110B illustrated in FIG. 2h may be obtained at the end of step S256.

At step S270, RSD regions may be formed at the opposing sides of the gate stack in alignment with the spacer structure. In accordance with some illustrative examples of the present disclosure, the semiconductor device 110B schematically illustrated in FIG. 2i may be obtained upon completion of step S270.

After a complete reading of the present disclosure, the person skilled in the art will appreciate that a second semiconductor device having a second gate dielectric material of a smaller thickness than the gate dielectric material may be formed in parallel to the semiconductor device.

The processes described above with regard to various illustrative embodiments of the present disclosure, e.g., FIGS. 2a-2i and 3, may be completed in accordance with known processes by contacting the RSD regions and the gate stacks by formation of silicide portions and so on.

In accordance with at least some illustrative embodiments of the present disclosure, a semiconductor device structure comprising one of SG and EG devices together with a ZG device may be formed by co-integrating one of SG and EG devices together with ZG devices on the same wafer. It is proposed to replace the formation of a spacer having a target thickness by a sequence of forming two "subspacers," together with an intermediate patterning of the gate dielectric material, such that a second subspacer of the two subspacers may be formed on the patterned gate dielectric material. Accordingly, the gate dielectric material of ZG devices may be reliably patterned and reliably encapsulated by the spacer structure having a target thickness.

In accordance with some special examples, the first and second spacers forming the spacer structures 116A, 116B may each have half the thickness of the target thickness.

In accordance with some illustrative embodiments of the present disclosure, one of the semiconductor devices 110A and 110B may be one of an NMOS device and a PMOS device and the other one of the semiconductor devices 110A and 110B may be one of an NMOS device and a PMOS device.

In accordance with some illustrative embodiments of the present disclosure, the gate stack 108A may have a length along a direction extending between the RSD regions 120 of at most 35 nm. In accordance with some illustrative examples herein, the gate stack 108B may have a length extending along a direction extending between the RSD regions 120 of at least 35 nm.

It is noted that the spacer formation of the ZG devices is not limited to what is presented here. It is understood that SG, EG and ZG devices can have different spacer thicknesses relatively independent of one another, based on the requirements of the device. A simple spacer 116A, similar to 116B, may be provided for simplification of describing the present invention.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device structure, comprising:
    forming a first gate stack comprising a first gate dielectric material and a first gate electrode material over a first active region in an upper surface portion of a substrate;
    forming a first spacer structure adjacent to said first gate stack; and
    forming first raised source/drain ("RSD") regions at opposing sides of said first gate stack on said first active region in alignment with said first spacer structure, wherein forming said first spacer structure comprises:
        forming a first spacer on sidewalls of said first gate stack, said first gate dielectric material extending between said first spacer and said upper surface portion;
        patterning said first gate dielectric material, wherein said first gate dielectric material has a greater length along a length direction extending between said first RSD regions than said gate electrode material, said first gate dielectric material extending below said first spacer, and wherein said patterning comprises at least partially removing said first gate dielectric material from below said first spacer; and
        forming a second spacer over said first spacer and said patterned first gate dielectric material.

2. The method of claim 1, wherein said patterned first gate dielectric material has a length along a length direction extending between said first RSD regions, which length is substantially equal to a length of said first gate electrode material along said length direction.

3. The method of claim 1, wherein said patterning comprises performing a cleaning process prior to forming said second spacer.

4. The method of claim 3, wherein said first gate dielectric material comprises a layer of silicon oxide and said cleaning process comprises diluted HF (dHF).

5. The method of claim 1, wherein said first spacer structure has a target thickness in a range from about 5-15 nm.

6. The method of claim 5, wherein said patterned first gate dielectric material has a length along a length direction extending between said first RSD regions of at least 35 nm.

7. The method of claim 5, wherein said first gate dielectric material comprises a layer of silicon oxide having a thickness of at least 3 nm.

8. The method of claim 1, further comprising:
    providing a second active region different from said first active region in said upper surface portion of a substrate;
    forming a second gate stack comprising a second gate dielectric material and a second gate electrode material over a second active region in said upper surface portion of a substrate, said second active region being different from said first active region, a thickness of said second gate dielectric material being substantially smaller than a thickness of said first gate dielectric material;
    forming a second spacer structure on said second gate stack in parallel to said first spacer structure, said second spacer structure covering sidewalls of said second gate stack and at least partially contacting said upper surface portion of said substrate adjacent to said second gate dielectric material; and
    forming second raised source drain ("RSD") regions at opposing sides of said second gate stack on said second active region in alignment with said second spacer structure.

9. The method of claim 8, wherein forming said second spacer structure in parallel to said first spacer structure comprises forming a third spacer on sidewalls of said second gate stack and forming a fourth spacer on said third spacer, said third spacer at least partially contacting said upper surface portion of said substrate.

10. The method of claim 8, wherein each of said first and second spacer structures has a target thickness, at least one of said target thicknesses being in a range from about 5-15 nm.

11. The method of claim 10, wherein said second gate dielectric material has a length along a length direction extending between said second RSD regions of at most 35 nm.

12. The method of claim 10, wherein said second gate dielectric material comprises a layer of silicon oxide having a thickness of at most 3 nm.

13. A semiconductor device structure, comprising:
    a first active region provided in an upper surface portion of a substrate;
    a first gate stack formed over said first active region, said first gate stack comprising a first gate dielectric material and a first gate electrode material;
    a first spacer structure formed on said first gate stack, wherein said first spacer structure contacts said upper surface portion of said substrate adjacent to said first gate dielectric material;
    first raised source/drain (RSD) regions formed at opposing sides of said first gate stack on said first active region in alignment with said first spacer structure;
    a second active region provided in said upper surface portion of said substrate, said second active region being different from said first active region;
    a second gate stack formed over said second active region, said second gate stack comprising a second gate dielectric material and a second gate electrode material, a thickness of said second gate dielectric material being smaller than a thickness of said first gate dielectric material;
    a second spacer structure formed on said second gate stack, said second spacer structure at least partially contacting said upper surface portion adjacent to said second gate dielectric material; and second RSD regions formed at opposing sides of said second gate stack on said second active region in alignment with said second spacer structure;

wherein said first spacer structure has a target thickness in a range from about 5-15 nm and said first gate dielectric material comprises a layer of silicon oxide having a thickness of at least 3 nm.

14. The semiconductor device structure of claim 13, wherein said first gate dielectric material comprises silicon oxide and said first spacer structure is formed by one of silicon nitride and siliconborocarbonitride.

15. The semiconductor device structure of claim 13, wherein said first gate dielectric material has a length along a length direction extending between said first RSD regions of at least 35 nm.

16. The semiconductor device structure of claim 13, wherein each of said first and second spacer structures has a target thickness, at least one of said target thicknesses being in a range from about 5-15 nm.

17. The semiconductor device structure of claim 16, wherein said second gate dielectric material has a length along a length direction extending between said second RSD regions of at most 35 nm.

18. The semiconductor device structure of claim 16, wherein said second gate dielectric material comprises a layer of silicon oxide having a thickness of at most 3 nm.

19. A method of forming a semiconductor device structure, comprising:
  forming a first gate stack comprising a first gate dielectric material and a first gate electrode material over a first active region in an upper surface portion of a substrate;
  forming a first spacer structure adjacent to said first gate stack;
  forming first raised source/drain ("RSD") regions at opposing sides of said first gate stack on said first active region in alignment with said first spacer structure, wherein forming said first spacer structure comprises:
    forming a first spacer on sidewalls of said first gate stack, said first gate dielectric material extending between said first spacer and said upper surface portion;
    patterning said first gate dielectric material; and
    forming a second spacer over said first spacer and said patterned first gate dielectric material;
  providing a second active region different from said first active region in said upper surface portion of said substrate;
  forming a second gate stack comprising a second gate dielectric material and a second gate electrode material over a second active region in said upper surface portion of said substrate, said second active region being different from said first active region, a thickness of said second gate dielectric material being substantially smaller than a thickness of said first gate dielectric material;
  forming a second spacer structure on said second gate stack in parallel to said first spacer structure, said second spacer structure covering sidewalls of said second gate stack and at least partially contacting said upper surface portion of said substrate adjacent to said second gate dielectric material; and
  forming second raised source drain ("RSD") regions at opposing sides of said second gate stack on said second active region in alignment with said second spacer structure.

20. The method of claim 19, wherein forming said second spacer structure in parallel to said first spacer structure comprises forming a third spacer on sidewalls of said second gate stack and forming a fourth spacer on said third spacer, said third spacer at least partially contacting said upper surface portion of said substrate.

* * * * *